United States Patent
Zhang

(10) Patent No.: US 10,263,153 B2
(45) Date of Patent: Apr. 16, 2019

(54) LIGHT-EMITTING DIODE (LED) DISPLAY ARRAY, MANUFACTURING METHOD THEREOF, AND WEARABLE DEVICE

(71) Applicant: BOE TECHNOLOGY GROUP CO., LTD., Beijing (CN)

(72) Inventor: Bo Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/566,054

(22) PCT Filed: May 25, 2017

(86) PCT No.: PCT/CN2017/085884
§ 371 (c)(1),
(2) Date: Oct. 12, 2017

(87) PCT Pub. No.: WO2018/010496
PCT Pub. Date: Jan. 18, 2018

(65) Prior Publication Data
US 2018/0315741 A1 Nov. 1, 2018

(30) Foreign Application Priority Data
Jul. 13, 2016 (CN) .......................... 2016 1 0550925

(51) Int. Cl.
| | | |
|---|---|---|
| H01L 33/36 | (2010.01) | |
| H01L 33/38 | (2010.01) | |
| H01L 33/40 | (2010.01) | |
| H01L 23/48 | (2006.01) | |
| H01L 27/15 | (2006.01) | |
| H01L 33/00 | (2010.01) | |

(Continued)

(52) U.S. Cl.
CPC .............. *H01L 33/36* (2013.01); *H01L 23/48* (2013.01); *H01L 24/13* (2013.01); *H01L 24/16* (2013.01);

(Continued)

(58) Field of Classification Search
CPC ............. H01L 23/498; H01L 23/49816; H01L 21/563; H01L 33/36; H01L 33/38;
(Continued)

(56) References Cited

U.S. PATENT DOCUMENTS

| | | | |
|---|---|---|---|
| 5,621,225 A | 4/1997 | Shieh et al. | |
| 8,441,123 B1 * | 5/2013 | Lee ........................ | H01L 21/563 257/737 |

(Continued)

FOREIGN PATENT DOCUMENTS

| | | |
|---|---|---|
| CN | 1507069 A | 6/2004 |
| CN | 1828375 A | 9/2006 |

(Continued)

OTHER PUBLICATIONS

Search Report and Written Opinion dated Jul. 27, 2017 from State Intellectual Property Office of the P.R. China.
Chinese Office Action dated Mar. 5, 2018.

*Primary Examiner* — Eduardo A Rodela
(74) *Attorney, Agent, or Firm* — Dilworth & Barrese, LLP; Michael J. Musella, Esq.

(57) ABSTRACT

A light-emitting diode (LED) display array, a manufacturing method thereof and a wearable device are provided. The LED display array comprises a first substrate and a second substrate arranged oppositely to each other. At least one pixel unit is formed on a surface of the first substrate facing the second substrate. At least one drive unit is formed on a surface of the second substrate facing the first substrate. Each pixel unit on the first substrate corresponds to a drive unit on the second substrate. A metal block is formed between each pixel unit and the drive unit corresponding to the pixel unit. The pixel unit is electrically connected with the drive unit corresponding to the pixel unit through the metal block.

18 Claims, 11 Drawing Sheets

(51) Int. Cl.
*H01L 23/00* (2006.01)
*H01L 25/075* (2006.01)
*H01L 25/16* (2006.01)
*H01L 33/60* (2010.01)
*H01L 33/62* (2010.01)

(52) U.S. Cl.
CPC .......... *H01L 24/81* (2013.01); *H01L 25/0753* (2013.01); *H01L 25/167* (2013.01); *H01L 27/15* (2013.01); *H01L 33/00* (2013.01); *H01L 33/38* (2013.01); *H01L 33/40* (2013.01); *H01L 33/60* (2013.01); *H01L 33/62* (2013.01); *H01L 2224/13144* (2013.01); *H01L 2224/13155* (2013.01); *H01L 2224/14* (2013.01); *H01L 2224/16145* (2013.01); *H01L 2224/81024* (2013.01); *H01L 2224/81815* (2013.01); *H01L 2924/014* (2013.01); *H01L 2924/12041* (2013.01); *H01L 2924/1426* (2013.01); *H01L 2933/0058* (2013.01); *H01L 2933/0066* (2013.01)

(58) Field of Classification Search
CPC ..... H01L 33/40; H01L 27/32; H01L 27/3225; H01L 27/3241; H01L 27/3248; H01L 27/3251; H01L 27/3262
See application file for complete search history.

(56) References Cited

U.S. PATENT DOCUMENTS

| | | | |
|---|---|---|---|
| 9,646,923 B2* | 5/2017 | Tseng | H01L 23/5283 |
| 2006/0197900 A1 | 9/2006 | Yim | |
| 2008/0018245 A1 | 1/2008 | Kim et al. | |
| 2008/0297042 A1* | 12/2008 | Ahn | H01L 27/3251 313/504 |
| 2010/0090211 A1 | 4/2010 | Fujii et al. | |
| 2011/0147748 A1 | 6/2011 | Baek | |
| 2013/0328191 A1* | 12/2013 | Meyer | H01L 23/3171 257/738 |
| 2013/0334445 A1* | 12/2013 | Tharumalingam | H01L 24/97 250/552 |
| 2015/0261996 A1* | 9/2015 | Kim | G06K 9/00255 348/14.03 |
| 2015/0340265 A1* | 11/2015 | Rudmann | H01L 21/6838 156/285 |

FOREIGN PATENT DOCUMENTS

| | | |
|---|---|---|
| CN | 101097911 A | 1/2008 |
| CN | 101174675 A | 5/2008 |
| CN | 102122649 A | 7/2011 |
| CN | 103165038 A | 6/2013 |
| CN | 106129028 A | 11/2016 |

* cited by examiner

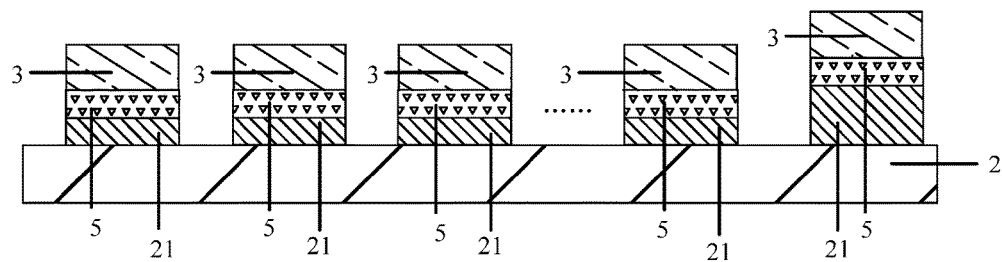
FIG. 18
Forming a first bonding layer on each pixel unit of the at least one pixel unit and each electrode unit of the at least one electrode unit, — 2051
Abutting the metal block on each drive unit against the first bonding layer on the pixel unit or the electrode unit corresponding to each drive unit, respectively. — 2052
FIG. 19
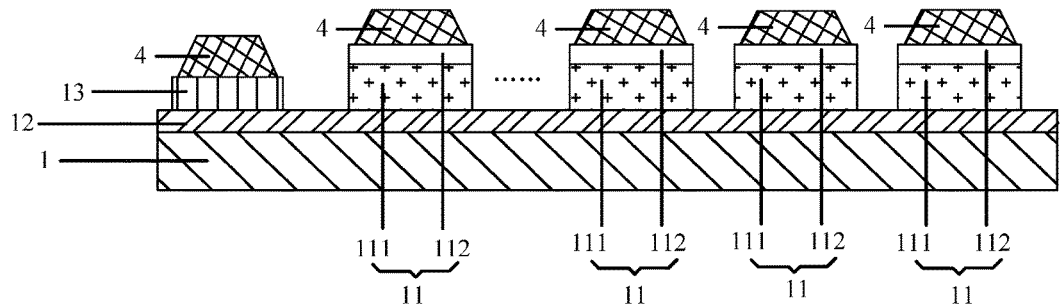
FIG. 20

LIGHT-EMITTING DIODE (LED) DISPLAY ARRAY, MANUFACTURING METHOD THEREOF, AND WEARABLE DEVICE

TECHNICAL FIELD

Embodiments of the present disclosure relate to a light-emitting diode (LED) display array, a manufacturing method thereof, and a wearable device.

BACKGROUND

With the development of electron technology, many small electronic devices emerge. The size of the small electronic device, such as wearable device, has small size. As the size of the small electronic device is small, a display screen of the small electronic device is also small. An LED display array may be adopted to manufacture the display screen of small size, the small electronic device may adopt the LED display array to manufacture the display screen.

SUMMARY

Embodiments of the present disclosure relate to an LED display array, a manufacturing method thereof, and a wearable device, which can solve a problem that the LED display array cannot be developed towards smaller size due to the press welding process.

According to at least one embodiment of the present disclosure, a light-emitting diode (LED) display array is provided. The light-emitting diode (LED) display array comprises a first substrate and a second substrate arranged oppositely to each other; at least one pixel unit formed on a surface of the first substrate facing the second substrate; at least one drive unit formed on a surface of the second substrate facing the first substrate, in which each pixel unit on the first substrate corresponds to a drive unit on the second substrate; and a metal block formed between each pixel unit and the drive unit corresponding to the pixel unit, in which the pixel unit is electrically connected with the drive unit corresponding to the pixel unit through the metal block.

For example, a first bonding layer is formed between each pixel unit and the metal block corresponding to the pixel unit; and a second bonding layer is formed between each drive unit and the metal block corresponding to the drive unit.

For example, a material of the first bonding layer is solder paste and a material of the second bonding layer is a nickel-gold alloy; or a material of the first bonding layer is a nickel-gold alloy and a material of the second bonding layer is solder paste.

For example, a common electrode layer is also formed on the surface of the first substrate facing the second substrate; the at least one pixel unit and the at least one electrode unit are formed on the common electrode layer, each electrode unit on the common electrode layer corresponds to a drive unit on the second substrate, the at least one pixel unit is arranged on the common electrode layer in one row or a plurality of rows, each row further comprises one electrode unit disposed at an end of the row, and the electrode units are all disposed in a same column; and the metal block is formed between each electrode unit and the drive unit corresponding to the electrode unit and configured to electrically connect the electrode unit and the drive unit corresponding to the electrode unit.

For example, the metal block has a sphere shape.

For example, a material of the metal block is indium.

For example, each pixel unit comprises an emission layer (EML) and a reflecting layer, the EML being formed on a surface of the first substrate facing the second substrate, and the reflecting layer being formed on a surface of the EML away from the first substrate.

Embodiments of the present disclosure also provide a wearable device, comprising the LED display array.

Embodiments of the present disclosure also provide a method for manufacturing an LED display array, comprising: forming at least one pixel unit on a surface of a first substrate; forming at least one drive unit on a surface of a second substrate facing the first substrate, in which each pixel unit on the first substrate corresponds to a drive unit on the second substrate; and forming a metal block between each pixel unit and the drive unit corresponding to the pixel unit, in which the pixel unit is electrically connected with the drive unit corresponding to the pixel unit through the metal block.

For example, forming the metal block on each pixel unit of the at least one pixel unit; abutting the metal block on each pixel unit against the drive unit corresponding to the pixel unit, respectively, to allow the metal block to be disposed between the pixel unit and the drive unit corresponding to the pixel unit; and performing a reflow soldering process to the pixel unit, the drive unit corresponding to the pixel unit, and the metal block disposed therebetween, to allow the metal block to electrically connect the pixel unit and the drive unit corresponding to the pixel unit.

For example, forming a first bonding layer on each pixel unit of the at least one pixel unit; forming the metal block on the first bonding layer on each pixel unit; forming a second bonding layer on each drive unit of the at least one drive unit; and abutting the metal block on each pixel unit against the second bonding layer on the drive unit corresponding to each pixel unit, respectively.

For example, coating a layer of soldering flux on the first bonding layer on each pixel unit before forming the metal block on the first bonding layer on each pixel unit.

For example, forming a metal block with a cubic structure on the first bonding layer on each pixel unit; and allowing the metal block on each pixel unit to form a spherical structure by a reflow annealing process under the assistant of the soldering flux.

For example, a material of the first bonding layer is a nickel-gold alloy and a material of the second bonding layer is solder paste.

For example, forming the metal block on each drive unit of the at least one drive unit; abutting the metal block on each drive unit against the pixel unit corresponding to each drive unit, respectively, to allow the metal block to be disposed between the drive unit and the pixel unit corresponding to the drive unit; and performing a reflow soldering process to the pixel unit, the drive unit corresponding to the pixel unit, and the metal block disposed therebetween, to allow the metal block to electrically connect the pixel unit and the drive unit corresponding to the pixel unit.

For example, forming a second bonding layer on each drive unit of the at least one drive unit; forming the metal block on the second bonding layer on each drive unit; forming a first bonding layer on each pixel unit of the at least one pixel unit; and abutting the metal block on each drive unit against the first bonding layer on the pixel unit corresponding to each drive unit, respectively.

For example, coating a layer of soldering flux on the second bonding layer on each drive unit before forming the metal block on the second bonding layer on each drive unit.

For example, forming a metal block with a cubic structure on the second bonding layer on each drive unit; and allowing the metal block on each drive unit to form a spherical structure by a reflow annealing process under the assistant of the soldering flux.

For example, a material of the second bonding layer is a nickel-gold alloy, and a material of the first bonding layer is solder paste.

For example, forming a common electrode layer on a surface of the first substrate, in which the at least one pixel unit and at least one electrode unit are formed on the common electrode layer, each electrode unit on the common electrode layer corresponds to one drive unit on the second substrate, the at least one pixel unit is arranged on the common electrode layer in one row or a plurality of rows, each row further comprises a electrode unit disposed at an end of the row, and the electrode units are all disposed in a same column. Forming the metal block between each electrode unit and the drive unit corresponding to the electrode unit, to allow the metal block to electrically connect the electrode unit and the drive unit corresponding to the electrode unit.

BRIEF DESCRIPTION OF THE DRAWINGS

Embodiments of the present disclosure will be described in detail hereinafter in conjunction with accompanying drawings to allow one of ordinary skill in the art to understand the present disclosure more clearly, in which:

FIGS. 17 and 18 are schematic structural views illustrating the manufacturing processes of the LED display array provided by the fourth embodiment of the present disclosure;

FIG. 19 is a flow diagram of a method for manufacturing an LED display array, provided by the fourth embodiment of the present disclosure; and FIGS. 20 and 21 are schematic structural views illustrating the manufacturing processes of the LED display array provided by the fourth embodiment of the present disclosure.

DETAILED DESCRIPTION

Technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment(s), without any creative work, which shall be within the scope of the present disclosure.

The current LED display array comprises: a first substrate and a second substrate. The first substrate and the second substrate are arranged oppositely to each other; at least one pixel unit is formed on a surface of the first substrate facing the second substrate; at least one drive unit is formed on a surface of the second substrate facing the first substrate; each pixel unit of the at least one pixel unit corresponds to one of the at least one drive unit; and each pixel unit is connected with the drive unit corresponding to the pixel unit through a metal wire.

The inventors found that following problems were present: as each pixel unit is connected with the drive unit corresponding to the pixel unit through the metal wire, and the two ends of the wire are respectively welded on the pixel unit and the drive unit corresponding to the pixel unit by pressure welding process, due to the limitation of the pressure welding process, the minimum size of the pixel unit and the drive unit corresponding to the pixel unit can only be in millimeter level, which limit the LED display array developing towards smaller size.

First Embodiment

Figure 1:
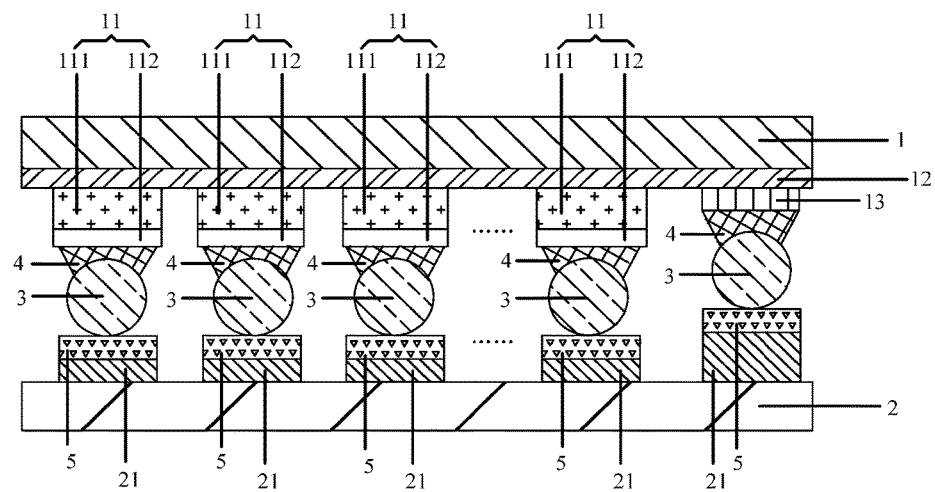
FIG. 1 is a schematic structural cross-sectional view of an LED display array provided by a first embodiment of the present disclosure.

To avoid the problem that the LED display array cannot be developed towards smaller size due to the limitation of the pressure welding process, as shown in FIG. 1, one embodiment of the present disclosure provides an LED display array, which comprises: a first substrate 1 and a second substrate 2, in which the first substrate 1 and the second substrate 2 are arranged oppositely to each other; at least one pixel unit 11 formed on a surface of the first substrate 1 facing the second substrate 2; at least one drive unit 21 formed on a surface of the second substrate 2 facing the first substrate 1, in which each pixel unit 11 on the first substrate 1 corresponds to a drive unit 21 on the second substrate 2; and a metal block 3 formed between each pixel unit 11 and the drive unit 21 corresponding to the pixel unit, in which the pixel unit 11 is electrically connected with the drive unit 21 corresponding to the pixel unit through the metal block 3.

The metal block 3 between each pixel unit 11 and the drive unit 21 corresponding to the pixel unit is formed by a patterning process.

In the embodiment of the present disclosure, as the metal block 3 is formed between each pixel unit 11 and the drive unit 21 corresponding to the pixel unit and the metal block 3 is formed by the patterning process, even the size of the pixel unit 11 and the drive unit 21 is small, the metal block 3 with small size may also be formed by a pattering process, so that each pixel unit 11 can be electrically connected with the drive unit 21 corresponding to the pixel unit through the metal block 3. Compared with the case that the pixel unit 11 is electrically connected with the drive unit 21 corresponding to the pixel unit through a metal wire by a pressure welding process, in the embodiment of the present disclosure, the size of the pixel unit 11 and the drive unit 21 corresponding to the pixel unit will not be limited by a pressure welding process, so the pixel unit 11 and the drive unit 21 corresponding to the pixel unit with smaller size can be prepared, and hence the LED display array can be developed towards smaller size. Meanwhile, as each pixel unit 11 is electrically connected with the drive unit 21 corresponding to the pixel unit through the metal block 3, a through circuit structure such as the metal wire can be omitted, so the resistance between each pixel unit 11 and the drive unit 21 corresponding to the pixel unit can be reduced, and the problem of signal delay can also be improved. For a large-size LED display array, each pixel unit 11 may also be electrically connected with the drive unit 21 corresponding to the pixel unit through the metal block 3, so as to reduce the resistance between each pixel unit 11 and the drive unit 21 corresponding to the pixel unit and improve the problem of signal delay.

In the embodiment of the present disclosure, after the metal block 3 is formed between each pixel unit 11 and the drive unit 21 corresponding to the pixel unit, each pixel unit 11, the drive unit 21 corresponding to each pixel unit 11, and the metal block 3 disposed between the pixel unit 11 and the drive unit 21 corresponding to the pixel unit may be subjected to a reflow welding process; and after the reflow welding process, the pixel unit 11 will be electrically connected with the drive unit 21 corresponding to the pixel unit through the metal block 3. The embodiments of the present disclosure are not limited thereto. The pixel unit 11 may also be electrically connected with the drive unit 21 corresponding to the pixel unit through the metal block 3 by other processes.

Figure 2:
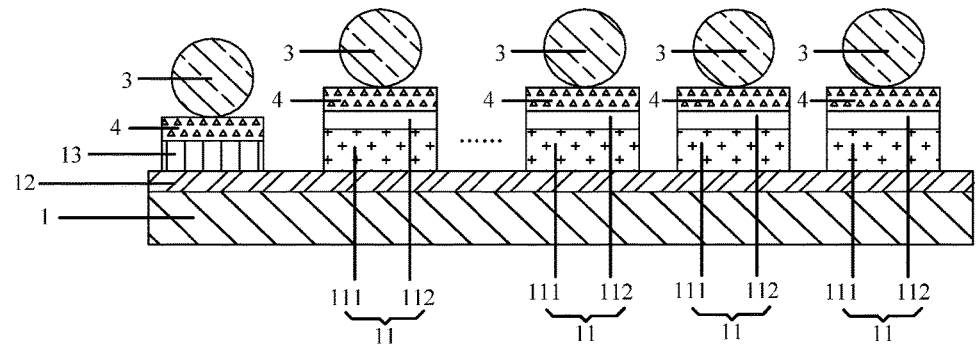
FIG. 2 is a schematic structural cross-sectional view of partial structures in the LED display array provided by the first embodiment of the present disclosure.
Figure 3:
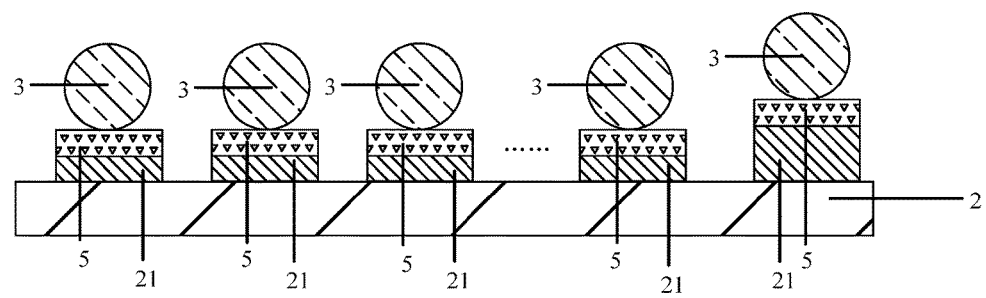
FIG. 3 is a schematic structural cross-sectional view of partial structures in the LED display array provided by the first embodiment of the present disclosure.

In an embodiment of the present disclosure, as shown in FIG. 2, the metal block 3 may be arranged on each pixel unit 11 disposed on the first substrate 1. As shown in FIG. 3, the metal block 3 may also be arranged on each drive unit 21 disposed on the second substrate 2.

In an embodiment of the present disclosure, the material of the metal block 3 may be indium. But the embodiments of the present disclosure are not limited thereto. The metal block 3 may be made of other metallic materials.

In the embodiment of the present disclosure, as each pixel unit 11 is electrically connected with the drive unit 21 corresponding to the pixel unit through a metal block 3, each drive unit 21 may drive the pixel unit 11 corresponding to the drive unit to emit light through the metal block 3, and the light emitted by the pixel unit 11 is reflected through the first substrate 1. The first substrate 1, for instance, may be a sapphire substrate. But the embodiments of the present disclosure are not limited thereto. The first substrate may also adopt other materials capable of reflecting the light emitted by the pixel unit 11.

As shown in FIG. 1, in the embodiment of the present disclosure, each pixel unit 11 includes an EML 111 and a reflecting layer 112.

The EML 11 is formed on a surface of the first substrate 1 facing the second substrate 2. The reflecting layer 112 is formed on a surface of the EML 111 away from the first substrate 1.

One part of light emitted by the EML 11 in the embodiment of the present disclosure may be emitted through the first substrate 1, and the other part is reflected by the reflecting layer 112 and emitted from the first substrate 1. In this way, the brightness of the LED display array can be improved.

The material of the reflecting layer 12 in the embodiment of the present disclosure may be silver, or aluminum, but the embodiments of the present disclosure are not limited thereto.

As shown in FIG. 1, in the embodiment of the present disclosure, a common electrode layer 12 is also formed on the surface of the first substrate 1 facing the second substrate 2; at least one pixel unit 11 and at least one electrode unit 13 are formed on the common electrode layer; each electrode unit 13 on the common electrode layer 12 corresponds to one drive unit 21 on the second substrate 2; at least one pixel unit 11 is arranged on the common electrode layer 12 in one row or a plurality of rows; each row further includes an electrode unit 13 disposed at an end of the row; the electrode units 13 are all disposed in a same column; and a metal block 3 is formed between each electrode unit 13 and the drive unit 21 corresponding to the electrode unit and configured to electrically connect the electrode unit 13 and the drive unit 21 corresponding to the electrode unit.

In the embodiment of the present disclosure, current is produced by the common electrode layer 12 and the at least one electrode unit 13 on the first substrate 1 and the drive unit 21 on the second substrate 2, and may transmit between each pixel unit 11 and the drive unit 21 corresponding to the pixel unit through the metal block 3, so as to drive the EML 111 of each pixel unit 11 to emit light.

In the embodiment of the present disclosure, each electrode unit 13 is also electrically connected with the drive unit 21 corresponding to the electrode unit through the metal block 3. Moreover, the metal block 3 is formed by a patterning process. In this way, the electrode unit 13 may also be manufactured to have smaller size, so that the LED display array can be developed towards smaller size. As shown in FIG. 2, the metal block 3 may be formed on each electrode unit 13 disposed on the first substrate 1, and as shown in FIG. 3, the metal block 3 may also be formed on each drive unit 21 disposed on the second substrate 2.

For instance, the substrate may be a flexible substrate made from plastics, but the embodiments of the present disclosure are not limited thereto.

As shown in FIG. 1, in the embodiment of the present disclosure, the shape of the metal block 3, for instance, may be a sphere.

In the embodiment of the present disclosure, when the shape of the metal block 3 is sphere-liked, in the reflow soldering process, the spherical metal block 3 will be converted into molten state, and the spherical metal block 3 in molten state has self-aligned pull effect. The self-aligned pull effect refers to a process that one interface with poor surface affinity may be pulled to the other interface with good surface affinity by the surface tension of the metal ball when the metal ball in molten state is on two interfaces with different surface affinities. In this way, each pixel unit 11 and the drive unit 21 corresponding to the pixel unit can be more accurately butted through the spherical metal block 3.

Figure 4:
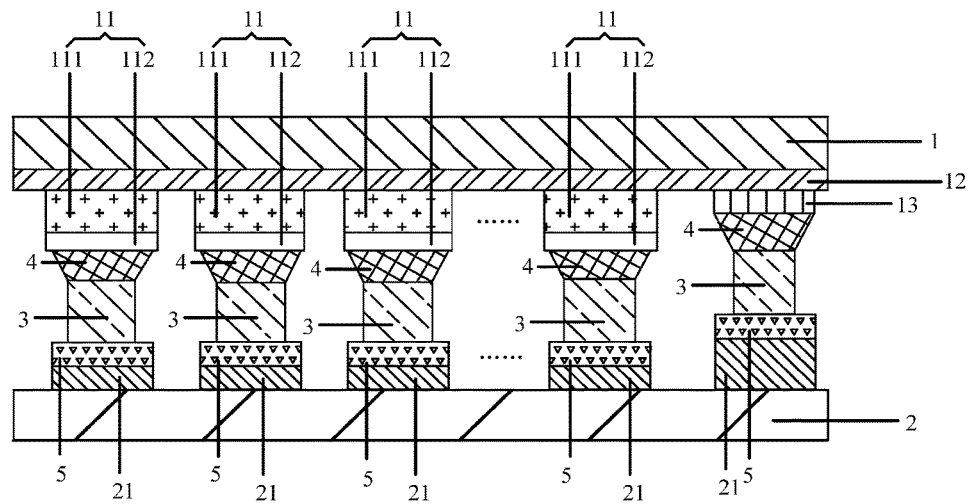
FIG. 4 is a schematic structural cross-sectional view of the LED display array provided by the first embodiment of the present disclosure.

In the embodiment of the present disclosure, the spherical metal block 3 may be formed by a reflow annealing process. If the spherical metal block 3 is formed on each pixel unit 11 disposed on the first substrate 1, a metal layer may be formed on each pixel unit 11 at first, and the structure of the metal layer is metal block(s) 3 with cubic structure; subsequently, the metal block(s) 3 with the cubic structure is/are converted into spherical structure(s) by a reflow annealing process. If the spherical metal block 3 is formed on each drive unit 21 disposed on the second substrate 2, the metal block 3 with cubic structure may be formed on each drive unit 21 at first, subsequently, the metal block 3 with the cubic structure is converted into a spherical structure by a reflow annealing process. As shown in FIG. 4, for instance, the shape of the metal block 3 may also be a cylindrical structure. But the embodiments of the present disclosure are not limited to sphere, and cylinder, which may also be in other shapes.

As shown in FIG. 1, in the embodiment of the present disclosure, a first bonding layer 4 is formed between each pixel unit 11 and the metal block 3 corresponding to the pixel unit; and a second bonding layer 5 is formed between each drive unit 21 and the metal block 3 corresponding to the drive unit. The first bonding layer 4 is configured to bond the pixel unit 11 and the metal block 3 corresponding to the pixel unit. The second bonding layer 5 is configured to bond the drive unit 21 and the metal block 3 corresponding to the drive unit.

In the embodiment of the present disclosure, when the first bonding layer 4 is formed on each pixel unit 11 and the second bonding layer 5 is formed on each drive unit 21, the metal block 3 is formed between the first bonding layer 4 and the second bonding layer 5. As shown in FIG. 2, the metal block 3 may be disposed on the first bonding layer 4, and as shown in FIG. 3, may also be disposed on the second bonding layer 5. The arrangement of the first bonding layer 4 can increase the adhesion between the metal block 3 and the pixel unit 11, and the arrangement of the second bonding layer 5 can increase the adhesion between the metal block 3 and the drive unit 21, so that the metal block 3 can be fixed between the pixel unit 11 and the drive unit 21 corresponding to the pixel unit. The first bonding layer 4 and the second bonding layer 5 are made of a conductive adhesive containing conductive particles, in this way, they will not affect the electrical connection between the metal block 3 and the pixel unit 11 and the drive unit 21.

In an embodiment of the present disclosure, for instance, the material of the first bonding layer 4 is solder paste, and the material of the second bonding layer 5 is a nickel-gold alloy; or the material of the first bonding layer 4 is a nickel-gold alloy, and the material of the second bonding layer 5 is solder paste. For instance, if the metal block 3 is to be formed in a spherical shape, the materials of the first bonding layer 4 and the second bonding layer 5 may be selected according to the arrangement position(s) of the metal block(s) 3. Detailed description will be given below.

Figure 5:
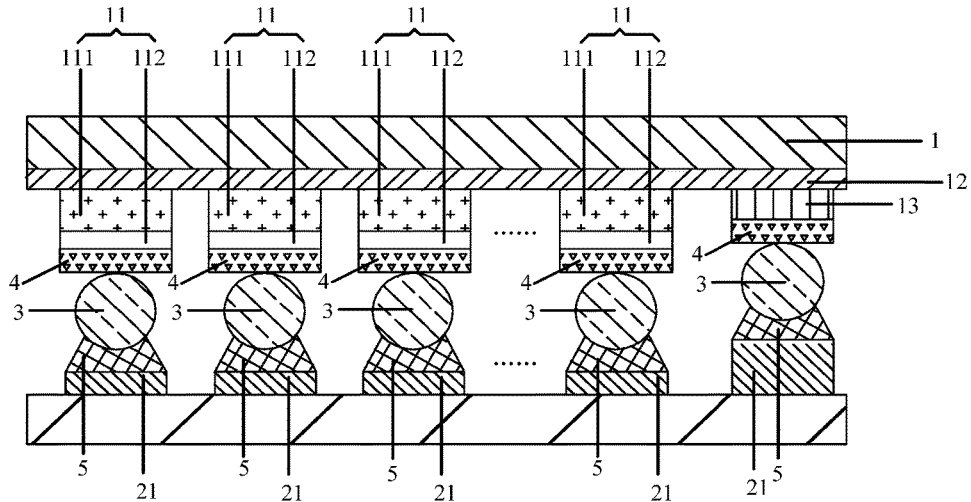
FIG. 5 is a schematic structural cross-sectional view of the LED display array provided by the first embodiment of the present disclosure.

As shown in FIGS. 2 and 5, if the spherical metal block 3 is required to be formed on each first bonding layer 4, the material of the first bonding layer 4 may select a nickel-gold alloy, as the nickel-gold alloy may help the metal layer to form a sphere in the process of converting the metal layer into the sphere by a reflow annealing process, and the nickel-gold alloy may allow the metal block 3 to be electrically connected with the pixel unit 11 corresponding to the metal block in the reflow annealing process. The material of the second bonding layer 5 may select solder paste, as the solder paste has certain viscosity and may allow the spherical metal block 3 to be more stably fixed on the drive unit 21, and the solder paste may allow the metal block 3 to be electrically connected with the drive unit 21 corresponding to the metal block in the reflow soldering process.

Similarly, as shown in FIGS. 3 and 1, if the spherical metal block 3 is required to be formed on each second bonding layer 5, the material of the second bonding layer 5 may select a nickel-gold alloy and the material of the first bonding layer 4 may select solder paste.

In the embodiment of the present disclosure, as the metal block 3 is formed between each pixel unit 11 and the drive unit 21 corresponding to the pixel unit, and the metal block 3 is formed by a patterning process, even the pixel unit 11 and the drive unit 21 have small size, the metal block 3 with small size may also be formed by the patterning process, to allow each pixel unit 11 to be electrically connected with the drive unit 21 corresponding to the pixel unit through the metal block 3. Compared with the case that the pixel unit 11 is electrically connected with the drive unit 21 corresponding to the pixel unit through a metal wire by a pressure welding process, in the embodiment of the present disclosure, the size of the pixel unit 11 and the drive unit 21 corresponding to the pixel unit will not be limited by the pressure welding process. In this way, the pixel unit 11 and the drive unit 21 corresponding to the pixel unit with smaller size can be manufactured, and the LED display array can be developed towards smaller size. As each pixel unit 11 is electrically connected with the drive unit 21 corresponding to the pixel unit through the metal block 3, a through circuit structure, such as metal wire, can be omitted, so the resistance between each pixel unit 11 and the drive unit 21 corresponding to the pixel unit can be reduced, and the problem of signal delay can also be improved. For a large-size LED display array, each pixel unit 11 may also be electrically connected with the drive unit 21 corresponding to the pixel unit through the metal block 3, so as to reduce the resistance between each pixel unit 11 and the drive unit 21 corresponding to the pixel unit and improve the problem of signal delay.

Second Embodiment

Embodiments of the present disclosure provide a wearable device, which comprises the LED display array provided by the first embodiment. The wearable device may be an augmented reality (AR) device, a virtual reality (VR) device, an intelligent watch, intelligent glasses, and the like.

In the LED display array provided by the embodiment of the present disclosure, as the metal block 3 is formed between each pixel unit 11 and the drive unit 21 corresponding to the pixel unit, and the metal block 3 is formed by a patterning process, even the pixel unit 11 and the drive unit 21 have small size, the metal block 3 with small size may also be formed by the patterning process, to allow each pixel unit 11 to be electrically connected with the drive unit 21 corresponding to the pixel unit through the metal block 3. Compared with the case that the pixel unit 11 is electrically connected with the drive unit 21 corresponding to the pixel unit through a metal wire by a pressure welding process, in the embodiment of the present disclosure, the size of the pixel unit 11 and the drive unit 21 corresponding to the pixel unit will not be limited by the pressure welding process, so the pixel unit 11 and the drive unit 21 corresponding to the pixel unit with even more smaller size can be manufactured. In this way, the LED display array can be developed towards smaller size, and the wearable device can be developed towards smaller size. Moreover, as each pixel unit 11 is electrically connected with the drive unit 21 corresponding to the pixel unit through the metal block 3, a through circuit structure, such as metal wire, can be omitted, so the resistance between each pixel unit 11 and the drive unit 21 corresponding to the pixel unit can be reduced. Meanwhile, the problem of signal delay can be improved, and the service performance of the wearable device can be improved.

Third Embodiment

Figure 6:
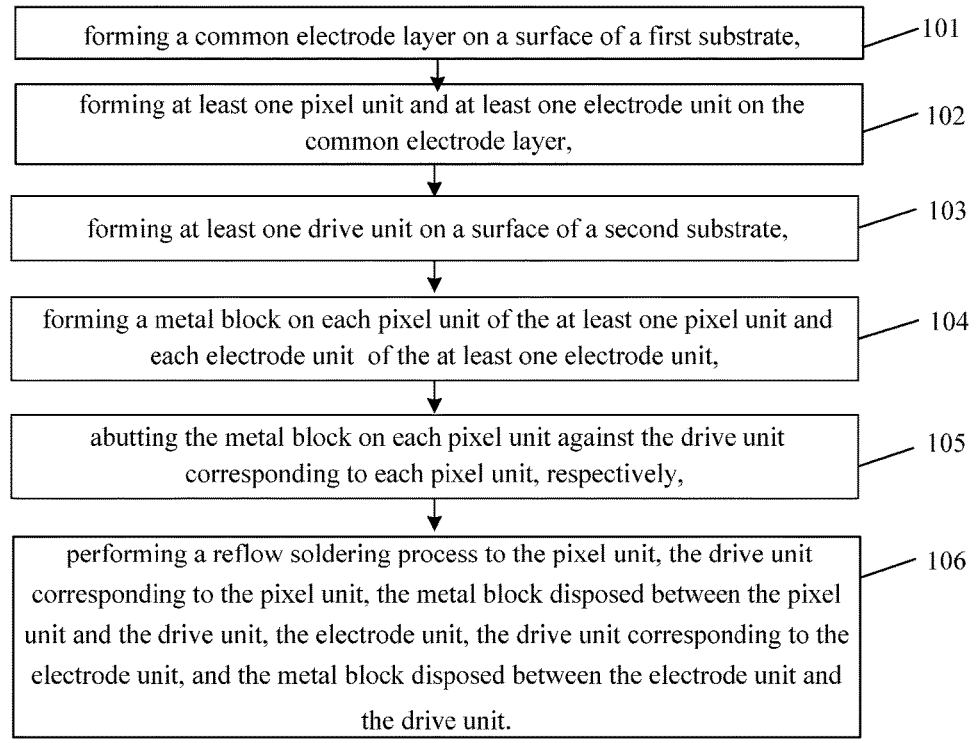
FIG. 6 is a flow diagram of a method for manufacturing an LED display array, provided by a third embodiment of the present disclosure.

Embodiments of the present disclosure provide a method for manufacturing an LED display array, which, as shown in FIG. 6, comprises the following steps.

Figure 7:
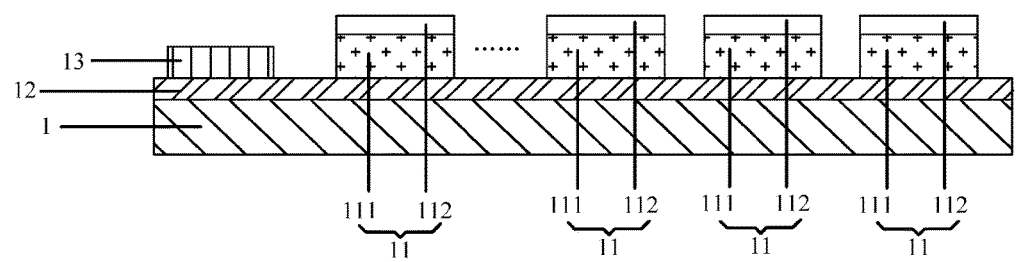
FIG. 7 is a schematic structural cross-sectional view of a first substrate, pixel units and electrode units in the third embodiment and a fourth embodiment of the present disclosure.

S101: as shown in FIG. 7, forming a common electrode layer 12 on a surface of a first substrate 1.

S102: as shown in FIG. 7, forming at least one pixel unit 11 and at least one electrode unit 13 on the common electrode layer 12.

FIG. 7 is a schematic structural cross-sectional view of the first substrate 1. As shown in FIG. 7, in the embodiment of the present disclosure, each pixel unit 11 of the at least one pixel unit 11 includes an EML 111 and a reflecting layer 112. At least one EML 111 may be formed on the common electrode layer 12 by a patterning process at first, subsequently, a reflecting layer 112 is formed on each EML 111 of the at least one EML 111 by a patterning process. The EML 111 and the reflecting layer 112 in each pixel unit 11 may also be simultaneously formed by a single patterning process.

In the embodiment of the present disclosure, the at least one pixel unit 11 is arranged on the common electrode layer 12 in one row or a plurality of rows; each row further includes a electrode unit 13; the electrode unit 13 is disposed at an end of the row; and the electrode units 13 are disposed in a same column. In FIG. 7, the electrode unit 13 in each row is disposed at the right end of the row, and the electrode units 13 are arranged in one column at the right ends of the first substrate 1.

Figure 8:
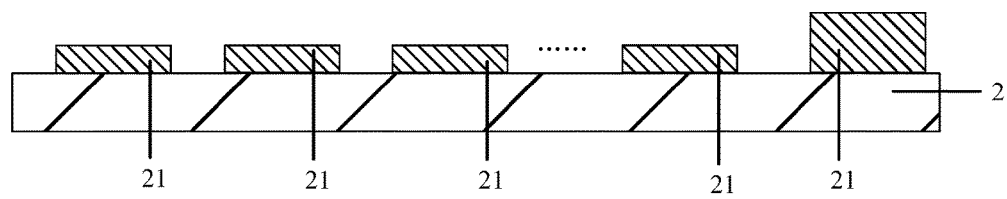
FIG. 8 is a schematic structural cross-sectional view of a second substrate and drive units in the third embodiment and the fourth embodiment of the present disclosure.

S103: as shown in FIG. 8, forming at least one drive unit 21 on a surface of a second substrate 2.

In the embodiment of the present disclosure, each pixel unit 11 on the common electrode layer 12 corresponds to a drive unit 21 on the second substrate 2, and each electrode unit 13 on the common electrode layer 12 corresponds to a drive unit 21 on the second substrate 2. As shown in FIG. 7, the height of the electrode unit 13 on the common electrode layer 12 is less than the height of the pixel unit 11. In order to obtain consistent height between the first substrate 1 and the second substrate 2, the height of the drive unit 21, corresponding to the electrode unit 13, on the second substrate 2 can be increased. The embodiments of the present disclosure are not limited thereto. For instance, the height of the electrode unit 13 and the drive unit 21 corresponding to the electrode unit may also adopt other designs.

S104: forming a metal block 3 on each pixel unit 11 of the at least one pixel unit 11 and each electrode unit 13 of the at least one electrode unit 13.

In the embodiment of the present disclosure, the shape of the metal block 3 may be a sphere, or a cylinder. The embodiments of the present disclosure are not limited thereto.

Figure 9:
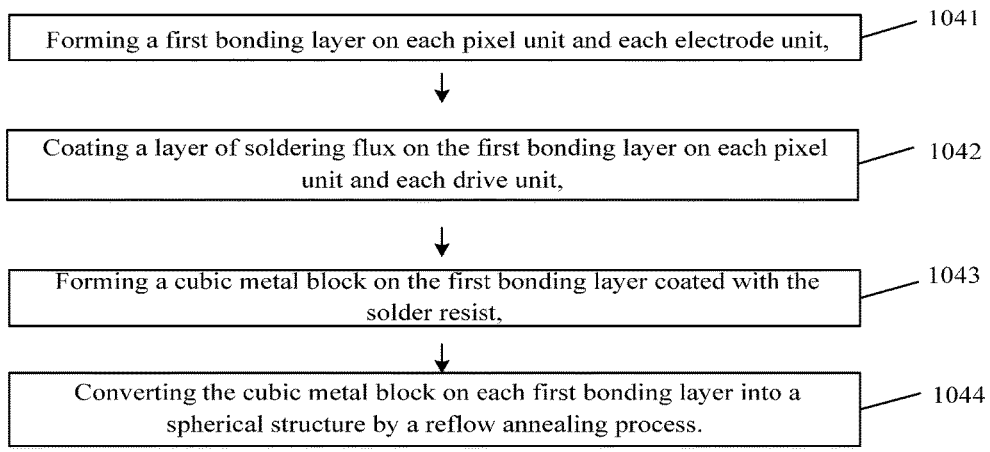
FIG. 9 is a flow diagram of a method for manufacturing the LED display array, provided by the third embodiment of the present disclosure.

When the shape of the metal block 3 is a sphere, as shown in FIG. 9, the step S104, for instance, may include the following steps.

Figure 10:
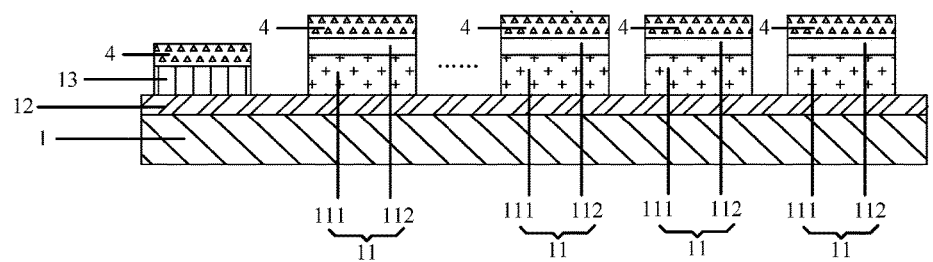
FIGS. 10 and 11 are schematic structural views illustrating the manufacturing processes of the LED display array provided by the third embodiment of the present disclosure.

S1041: as shown in FIGS. 7 and 10, forming a first bonding layer 4 on each pixel unit 11 and each electrode unit 13.

For instance, the first bonding layer 4 may be formed on each pixel unit 11 and each electrode unit 13 by a patterning process. The material of the first bonding layer 4 may be a nickel-gold alloy.

S1042: coating a layer of soldering flux on the first bonding layer 4 on each pixel unit 11 and each drive unit 21.

Figure 11:
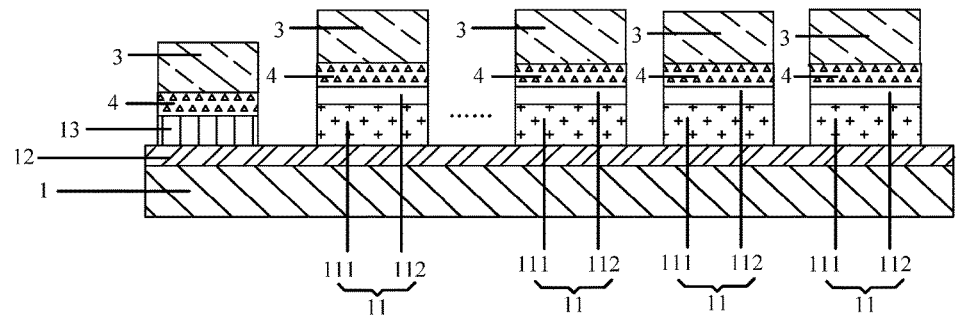

S1043: as shown in FIGS. 10 and 11, forming a cubic metal block 3 on the first bonding layer 4 coated with the soldering flux.

For instance, a metal layer may be formed on each first bonding layer 4 coated with the soldering flux by a patterning process, and the metal layer is a metal block 3 with a cubic structure.

S1044: as shown in FIGS. 11 and 2, converting the cubic metal block 3 on each first bonding layer into a spherical structure by a re-flow annealing process.

As the material of the first bonding layer 4 is a nickel-gold alloy and the first bonding layer 4 is coated with the soldering flux, the nickel-gold alloy and the soldering flux will help the cubic metal block 3 to form the spherical structure in the reflow annealing process. Meanwhile, the metal block 3 is electrically connected with the pixel unit 11 or the electrode unit 13 through the first bonding layer 4 in the reflow annealing process.

S105: abutting the metal block 3 on each pixel unit 11 against the drive unit 21 corresponding to each pixel unit 11, respectively, and abutting the metal block 3 on each electrode unit 13 against the drive unit 21 corresponding to each electrode unit 13, respectively.

Figure 12:
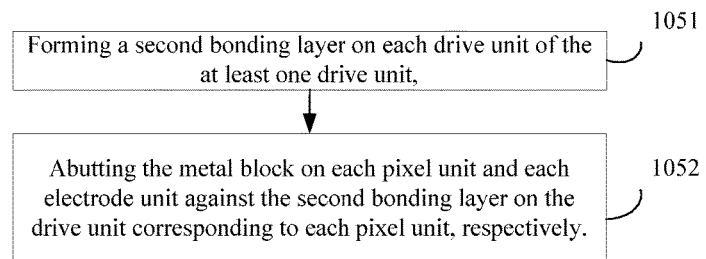
FIG. 12 is a flow diagram of a method for manufacturing the LED display array, provided by the third embodiment of the present disclosure.

As shown in FIG. 12, the step S105, for instance, may include the following steps.

Figure 13:
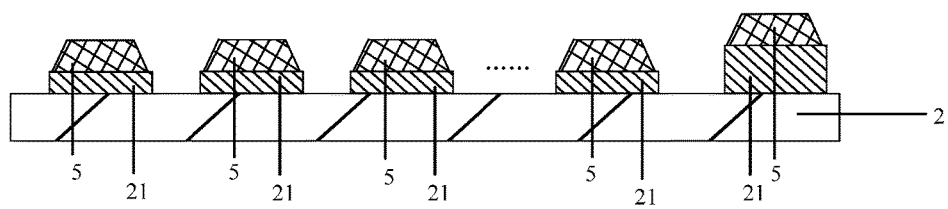
FIGS. 13 and 14 are schematic structural views illustrating the manufacturing processes of the LED display array provided by the third embodiment of the present disclosure.

S1051: as shown in FIG. 13, forming a second bonding layer 5 on each drive unit 21 of the at least one drive unit 21.

For instance, the material of the second bonding layer 5 may be solder paste. A layer of solder paste is coated on each drive unit 21 by screen printing.

Figure 14:
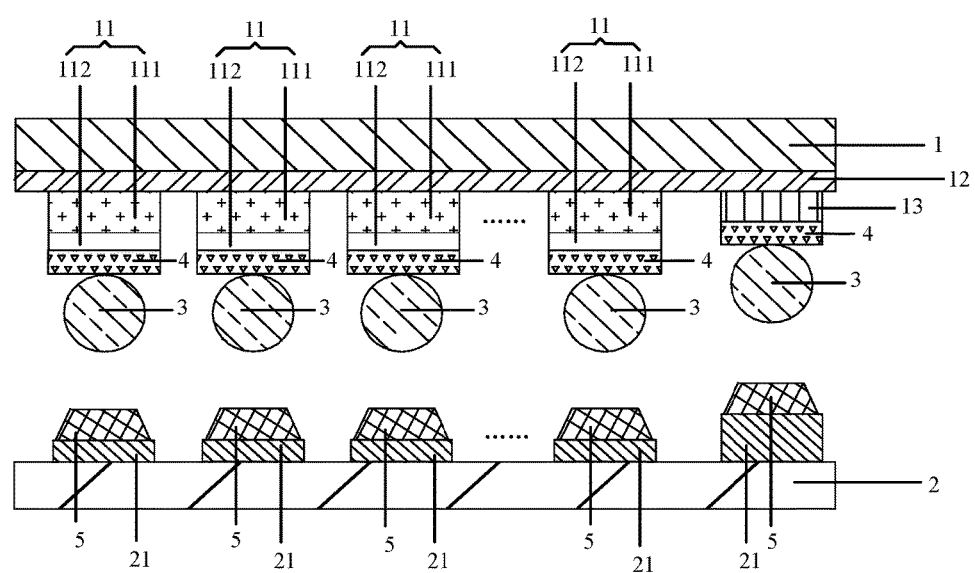

S1052: as shown in FIGS. 14 and 5, respectively abutting the metal blocks 3 on each pixel unit 11 and each electrode unit 13 against the second bonding layer 5 on the drive unit 21 corresponding to each pixel unit 11.

S106: as shown in FIG. 5, performing a reflow soldering process to the pixel unit 11, the drive unit 21 corresponding to the pixel unit 11, the metal block 3 disposed between the pixel unit and the drive unit, the electrode unit 13, the drive unit 21 corresponding to the electrode unit 13, and the metal block 3 disposed between the electrode unit and the drive unit, to allow the metal block 3 to electrically connect the pixel unit 11 and the drive unit 21 corresponding to the pixel unit and electrically connect the electrode unit 13 and the drive unit 21 corresponding to the electrode unit.

In the reflow soldering process, the metal block 3 is electrically connected with the drive unit 21 corresponding to the metal block through the second bonding layer 5, to allow the metal block 3 to electrically connect the pixel unit 11 and the drive unit 21 corresponding to the pixel unit and electrically connect the electrode unit 13 and the drive unit 21 corresponding to the electrode unit.

In the LED display array provided by the embodiment of the present disclosure, as the metal block 3 is formed between each pixel unit 11 and the drive unit 21 corresponding to the pixel unit by a patterning process, even the pixel unit 11 and the drive unit 21 have small size, the metal block 3 with small size may also be formed by a patterning process, to allow each pixel unit 11 to be electrically connected with the drive unit 21 corresponding to the pixel unit through the metal block 3. Compared with the case that the pixel unit 11 is electrically connected with the drive unit 21 corresponding to the pixel unit through a metal wire by a pressure welding process, in the embodiment of the present disclosure, the size of the pixel unit 11 and the drive unit 21 corresponding to the pixel unit will not be limited by the pressure welding process, so the pixel unit 11 and the drive unit 21 corresponding to the pixel unit with smaller size can be manufactured. In this way, the LED display array can be developed towards smaller size, and the wearable device can be developed towards smaller size. Moreover, as each pixel unit 11 is electrically connected with the drive unit 21 corresponding to the pixel unit through the metal block 3, a through circuit structure, such as metal wire, can be omitted, so the resistance between each pixel unit 11 and the drive unit 21 corresponding to the pixel unit can be reduced. Meanwhile, the problem of signal delay can be improved, and the service performance of the wearable device can be improved.

Fourth Embodiment

Figure 15:
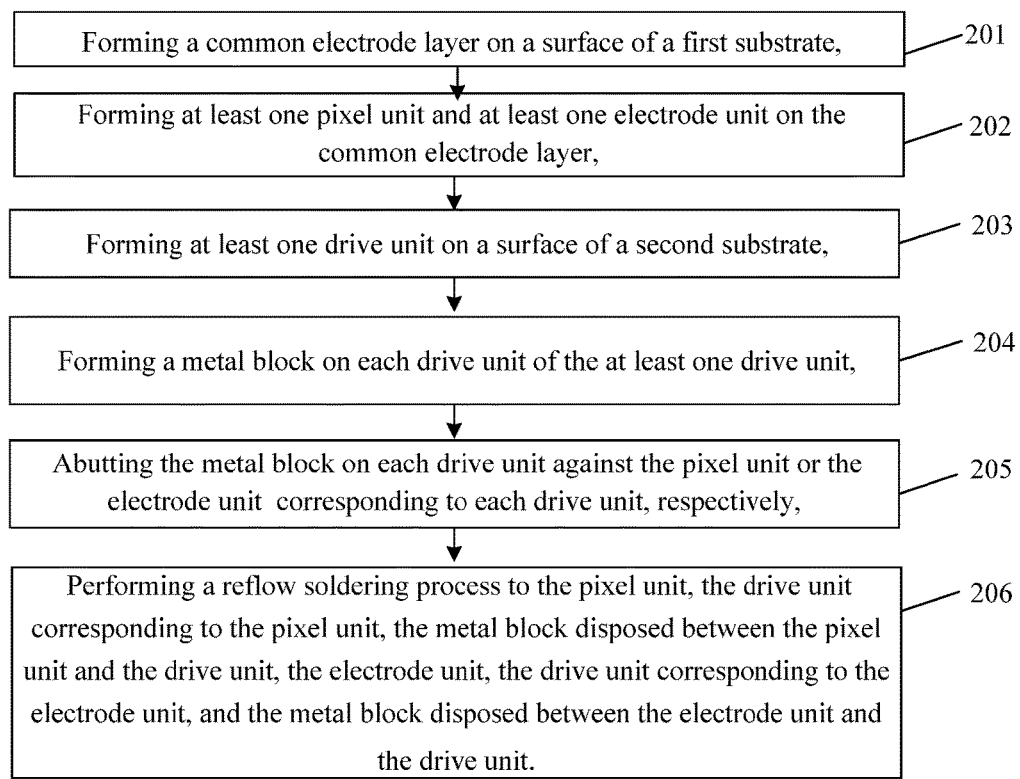
FIGS. 15 and 16 are schematic structural views illustrating the manufacturing processes of an LED display array provided by the fourth embodiment of the present disclosure.

Embodiments of the present disclosure provide a method for manufacturing an LED display array, which, as shown in FIG. 15, comprises the following steps.

S201: as shown in FIG. 7, forming a common electrode layer 12 on a surface of a first substrate 1.

S202: as shown in FIG. 7, forming at least one pixel unit 11 and at least one electrode unit 13 on the common electrode layer 12.

FIG. 7 is a schematic structural cross-sectional view of the first substrate 1. As shown in FIG. 7, in the embodiment of the present disclosure, each pixel unit 11 of the at least one pixel unit 11 includes an EML 111 and a reflecting layer 112. The EML 111 may be formed on the common electrode layer 12 by a patterning process at first, subsequently, the reflecting layer 112 is formed on each EML 111 of the at least one EML 111 by a patterning process. The EML 111 and the reflecting layer 112 in each pixel unit 11 may also be simultaneously formed by a single patterning process.

In the embodiment of the present disclosure, the at least one pixel unit 11 is arranged on the common electrode layer 12 in one row or a plurality of rows; each row further includes a electrode unit 13; the electrode unit 13 is disposed at an end of the row; and the electrode units 13 are all disposed in a same column. In FIG. 7, the electrode unit 13 in each row is disposed at the right end of the row, and the electrode units 13 are arranged in a column at the right ends of the first substrate 1.

S203: as shown in FIG. 8, forming at least one drive unit 21 on a surface of a second substrate 2.

For instance, the at least one drive unit 21 may be formed on the surface of the second substrate 2 by a patterning process.

In the embodiment of the present disclosure, each pixel unit 11 on the common electrode layer 12 corresponds to a drive unit 21 on the second substrate 2, and each electrode unit 13 on the common electrode layer 12 corresponds to a drive unit 21 on the second substrate 2. As shown in FIG. 7, the height of the electrode unit 13 on the common electrode layer 12 is less than the height of the pixel unit 11. To obtain consistent height between the first substrate 1 and the second substrate 2, the height of the drive unit 21 corresponding to the electrode unit 13 on the second substrate 2 can be increased. The embodiments of the present disclosure are not limited thereto. For instance, the height of the electrode unit 13 and the drive unit 21 corresponding to the electrode unit may also adopt other designs.

S204: forming a metal block 3 on each drive unit 21 of the at least one drive unit 21.

In the embodiment of the present disclosure, the shape of the metal block 3 may be a sphere, or a cylinder. The embodiments of the present disclosure are not limited thereto.

Figure 16:
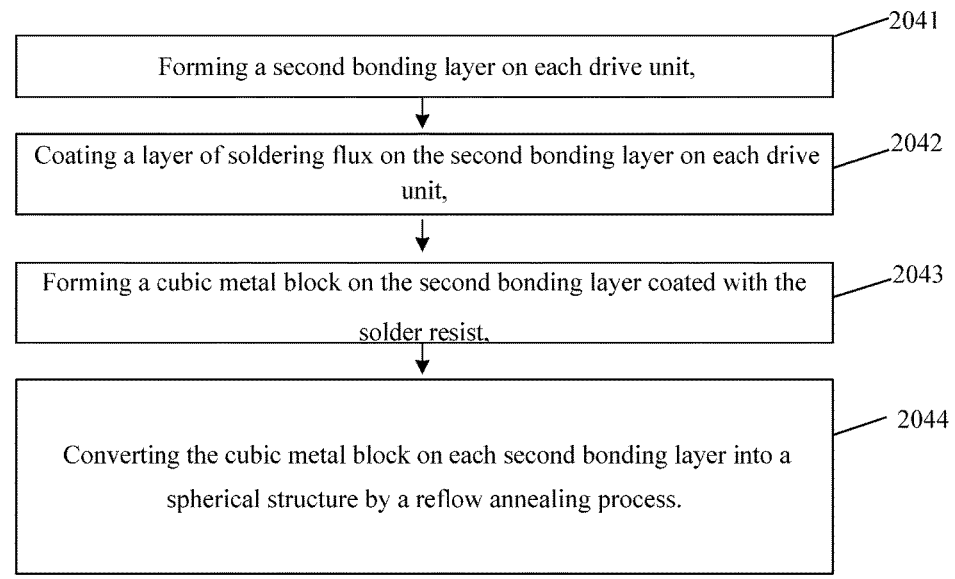

When the shape of the metal block 3 is a sphere, as shown in FIG. 16, the step S204, for instance, may include the following steps.

Figure 17:
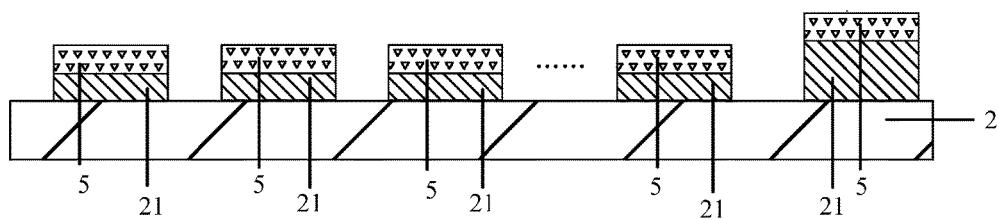

S2041: as shown in FIGS. 8 and 17, forming a second bonding layer 5 on each drive unit 21.

For instance, the second bonding layer 5 may be formed on each pixel unit 11 and each electrode unit 13 by a patterning process. The material of the second bonding layer 5 may be a nickel-gold alloy.

S2042: coating a layer of soldering flux on the second bonding layer 5 on each drive unit 21.

S2043: as shown in FIGS. 17 and 18, forming a cubic metal block 3 on the second bonding layer 5 coated with the soldering flux.

For instance, a metal layer may be formed on each second bonding layer 5 coated with the soldering flux by a patterning process, and the metal layer is a metal block 3 with a cubic structure.

S2044: as shown in FIGS. 18 and 5, converting the cubic metal block 3 on each second bonding layer 5 into a spherical structure by a reflow annealing process.

The material of the second bonding layer 5 is a nickel-gold alloy and the second bonding layer 5 is coated with the soldering flux. The nickel-gold alloy and the soldering flux will help the cubic metal block 3 to form a spherical structure in the reflow annealing process. Moreover, in the reflow annealing process, the metal block 3 is electrically connected with the drive unit 21 through the second bonding layer 5.

S205: abutting the metal block 3 on each drive unit 21 against the pixel unit 11, or the electrode unit 13 corresponding to each drive unit 21.

As shown in FIG. 19, the step S205, for instance, may include:

S2051: as shown in FIG. 20, forming a first bonding layer 4 on each pixel unit 11 of the at least one pixel unit 11 and each electrode unit 13 of the at least one electrode unit 13.

For instance, the material of the first bonding layer 4 may be solder paste. A layer of solder paste may be coated on each drive unit 21 by screen printing.

Figure 21:
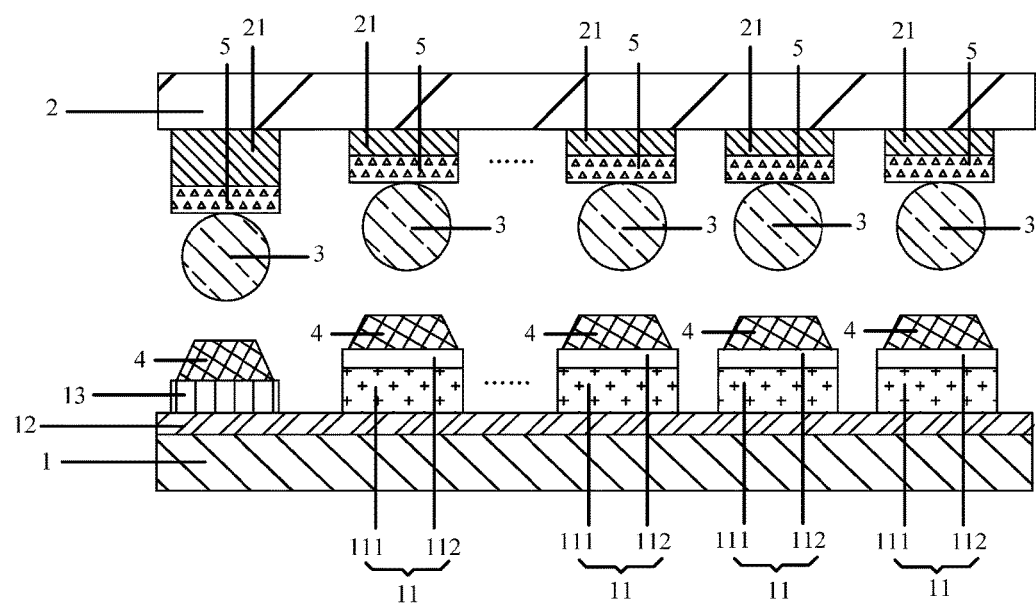

S2052: as shown in FIGS. 21 and 1, abutting the metal block 3 on each drive unit 21 against the first bonding layer 4 on the pixel unit 11, or the electrode unit 13 corresponding to each drive unit 21.

S206: as shown in FIG. 1, performing a reflow soldering process to the pixel unit 11, the drive unit 21 corresponding to the pixel unit 11, the metal block 3 disposed between the pixel unit and the drive unit, the electrode unit 13, the drive unit 21 corresponding to the electrode unit 13, and the metal block 3 disposed between the electrode unit and the drive unit, so that the metal block 3 can electrically connect the pixel unit 11 and the drive unit 21 corresponding to the pixel unit and electrically connect the electrode unit 13 and the drive unit 21 corresponding to the electrode unit.

In the reflow soldering process, the metal block 3 is electrically connected with the drive unit 21 corresponding to the metal block through the first bonding layer 4, so that the metal block 3 can electrically connect the pixel unit 11 and the drive unit 21 corresponding to the pixel unit and electrically connect the electrode unit 13 and the drive unit 21 corresponding to the electrode unit.

In the LED display array provided by the embodiment of the present disclosure, as the metal block 3 is formed between each pixel unit 11 and the drive unit 21 corresponding to the pixel unit by a patterning process, even the pixel unit 11 and the drive unit 21 have small size, the metal block 3 with small size may also be formed by the patterning process, so that each pixel unit 11 can be electrically connected with the drive unit 21 corresponding to the pixel unit through the metal block 3. Compared with the case that the pixel unit 11 is electrically connected with the drive unit 21 corresponding to the pixel unit through metal wire by a pressure welding process, in the embodiment of the present disclosure, the size of the pixel unit 11 and the drive unit 21 corresponding to the pixel unit will not be limited by the pressure welding process, so the pixel unit 11 and the drive unit 21 corresponding to the pixel unit with smaller size can be formed. In this way, the LED display array can be developed towards smaller size, and the wearable device can be developed towards smaller size. Moreover, as each pixel unit 11 is electrically connected with the drive unit 21 corresponding to the pixel unit through a metal block 3, a through circuit structure, such as the wire, can be omitted, so the resistance between each pixel unit 11 and the drive unit 21 corresponding to the pixel unit can be reduced. Meanwhile, the problem of signal delay can be improved, and the service performance of the wearable device can be improved.

The described above are only exemplary embodiments of the present disclosure and not intended to limit the present disclosure. Any modification, equivalent replacement, improvement and the like made within the spirit and principle of the embodiments of the present disclosure shall fall within the scope of the present disclosure.

The present application claims priority of the Chinese patent application No. 201610550925.2, filed on Jul. 13, 2016 with SIPO and entitled "LED Display Array, Manufacturing Method thereof, and Wearable Device", which is incorporated herein by reference in its entirety.

What is claimed is:

1. A light-emitting diode (LED) display array, comprising:
    a first substrate and a second substrate arranged oppositely to each other;
    at least one pixel unit formed on a surface of the first substrate facing the second substrate;
    at least one drive unit formed on a surface of the second substrate facing the first substrate, in which each pixel unit on the first substrate corresponds to a drive unit on the second substrate; and
    a metal block formed between each pixel unit and the drive unit corresponding to the pixel unit, in which the pixel unit is electrically connected with the drive unit corresponding to the pixel unit through the metal block; and
    a common electrode layer formed on the surface of the first substrate facing the second substrate;
    wherein the at least one pixel unit and at least one electrode unit are formed on the common electrode layer, each electrode unit on the common electrode layer corresponds to a drive unit on the second substrate, the at least one pixel unit is arranged on the common electrode layer in one row or a plurality of rows, each row further comprises the at least one electrode unit disposed at an end of the row, and the at least one electrode unit on the common electrode layer are all disposed in a same column; and the metal block is formed between each electrode unit and the drive unit corresponding to the electrode unit and configured to electrically connect the electrode unit and the drive unit corresponding to the electrode unit.

2. The LED display array according to claim 1, further comprising:
    a first bonding layer formed between each pixel unit and the metal block corresponding to the pixel unit; and
    a second bonding layer formed between each drive unit and the metal block corresponding to the drive unit.

3. The LED display array according to claim 2, wherein a material of the first bonding layer is solder paste and a material of the second bonding layer is a nickel-gold alloy; or a material of the first bonding layer is a nickel-gold alloy and a material of the second bonding layer is solder paste.

4. The LED display array according to claim 1, wherein the metal block has a sphere shape.

5. The LED display array according to claim 4, wherein a material of the metal block is indium.

6. The LED display array according to claim 1, wherein each pixel unit comprises an emission layer (EML) and a reflecting layer, the EML being formed on a surface of the first substrate facing the second substrate, and the reflecting layer being formed on a surface of the EML away from the first substrate.

7. A wearable device, comprising the LED display array according to claim 1.

8. A method for manufacturing an LED display array, comprising:
    forming at least one pixel unit on a surface of a first substrate;
    forming at least one drive unit on a surface of a second substrate facing the first substrate, in which each pixel unit on the first substrate corresponds to a drive unit on the second substrate;
    forming a metal block between each pixel unit and the drive unit corresponding to the pixel unit, in which the pixel unit is electrically connected with the drive unit corresponding to the pixel unit through the metal block;
    forming a common electrode layer on a surface of the first substrate, wherein the at least one pixel unit and at least one electrode unit are formed on the common electrode layer, each electrode unit on the common electrode layer corresponds to one drive unit on the second substrate, the at least one pixel unit is arranged on the common electrode layer in one row or a plurality of rows, each row further comprises an electrode unit disposed at an end of the row, and the electrode units are all disposed in a same column; and
    forming the metal block between each electrode unit and the drive unit corresponding to the electrode unit, to allow the metal block to electrically connect the electrode unit and the drive unit corresponding to the electrode unit.

9. The manufacturing method according to claim 8, further comprising:
    forming the metal block on each pixel unit of the at least one pixel unit;
    abutting the metal block on each pixel unit against the drive unit corresponding to the pixel unit, respectively, to allow the metal block to be disposed between the pixel unit and the drive unit corresponding to the pixel unit; and performing a reflow soldering process to the pixel unit, the drive unit corresponding to the pixel unit, and the metal block disposed therebetween, to allow the metal block to electrically connect the pixel unit and the drive unit corresponding to the pixel unit.

10. The manufacturing method according to claim 9, further comprising:
    forming a first bonding layer on each pixel unit of the at least one pixel unit;
    forming the metal block on the first bonding layer on each pixel unit;
    forming a second bonding layer on each drive unit of the at least one drive unit; and
    abutting the metal block on each pixel unit against the second bonding layer on the drive unit corresponding to each pixel unit, respectively.

11. The manufacturing method according to claim 10, further comprising: coating a layer of soldering flux on the first bonding layer on each pixel unit before forming the metal block on the first bonding layer on each pixel unit.

12. The manufacturing method according to claim 11, further comprising:
    forming a metal block with a cubic structure on the first bonding layer on each pixel unit; and
    allowing the metal block on each pixel unit to form a spherical structure by a reflow annealing process under the assistant of the soldering flux.

13. The manufacturing method according to claim 11, wherein a material of the first bonding layer is a nickel-gold alloy and a material of the second bonding layer is solder paste.

14. The manufacturing method according to claim 8, further comprising:
    forming the metal block on each drive unit of the at least one drive unit;
    abutting the metal block on each drive unit against the pixel unit corresponding to each drive unit, respectively, to allow the metal block to be disposed between the drive unit and the pixel unit corresponding to the drive unit; and
    performing a reflow soldering process to the pixel unit, the drive unit corresponding to the pixel unit, and the metal block disposed therebetween, to allow the metal block to electrically connect the pixel unit and the drive unit corresponding to the pixel unit.

15. The manufacturing method according to claim 14, further comprising:
    forming a second bonding layer on each drive unit of the at least one drive unit;
    forming the metal block on the second bonding layer on each drive unit;
    forming a first bonding layer on each pixel unit of the at least one pixel unit; and
    abutting the metal block on each drive unit against the first bonding layer on the pixel unit corresponding to each drive unit, respectively.

16. The manufacturing method according to claim 15, further comprising: coating a layer of soldering flux on the second bonding layer on each drive unit before forming the metal block on the second bonding layer on each drive unit.

17. The manufacturing method according to claim 16, further comprising:
    forming a metal block with a cubic structure on the second bonding layer on each drive unit; and
    allowing the metal block on each drive unit to form a spherical structure by a reflow annealing process under the assistant of the soldering flux.

18. The manufacturing method according to claim 16, wherein a material of the second bonding layer is a nickel-gold alloy and a material of the first bonding layer is solder paste.

* * * * *